United States Patent
Chung et al.

(10) Patent No.: US 9,299,483 B2
(45) Date of Patent: Mar. 29, 2016

(54) METHOD FOR MANUFACTURING TRANSPARENT CONDUCTIVE FILM

(75) Inventors: Kwang Choon Chung, Yongin-si (KR); Hyun Nam Cho, Gunpo-si (KR); Ji Hoon Yoo, Bucheon-si (KR); Yun-Ho Jung, Ansan-si (KR)

(73) Assignee: Inktec Co., Ltd., Kyeongki-do (KR)

( * ) Notice: Subject to any disclaimer, the term of this patent is extended or adjusted under 35 U.S.C. 154(b) by 0 days.

(21) Appl. No.: 13/813,253

(22) PCT Filed: Jul. 28, 2011

(86) PCT No.: PCT/KR2011/005581
§ 371 (c)(1),
(2), (4) Date: Jan. 30, 2013

(87) PCT Pub. No.: WO2012/015263
PCT Pub. Date: Feb. 2, 2012

(65) Prior Publication Data
US 2013/0118786 A1    May 16, 2013

(30) Foreign Application Priority Data

Jul. 30, 2010  (KR) .................. 10-2010-0074393

(51) Int. Cl.
| | |
|---|---|
| B05D 5/12 | (2006.01) |
| H01B 13/00 | (2006.01) |
| H01B 1/02 | (2006.01) |
| H05K 1/02 | (2006.01) |
| H05K 3/10 | (2006.01) |
| C23C 20/00 | (2006.01) |
| C23C 18/02 | (2006.01) |

(52) U.S. Cl.
CPC ............. *H01B 13/00* (2013.01); *H01B 1/02* (2013.01); *H05K 1/02* (2013.01); *C23C 18/02* (2013.01); *C23C 20/00* (2013.01); *H05K 3/10* (2013.01)

(58) Field of Classification Search
USPC .............. 427/108–110, 123, 379, 383.1
See application file for complete search history.

(56) References Cited

U.S. PATENT DOCUMENTS

| | | | |
|---|---|---|---|
| 4,542,214 A |  | 9/1985 | Bechara |
| 5,540,133 A | * | 7/1996 | Draper et al. ............... 84/471 R |
| 6,117,366 A |  | 9/2000 | Park et al. |
| 6,712,998 B2 |  | 3/2004 | Kato |
| 7,300,537 B2 |  | 11/2007 | O'Donnell et al. |
| 7,736,693 B2 |  | 6/2010 | Garbar et al. |
| 8,105,472 B2 |  | 1/2012 | Garbar et al. |
| 2005/0215689 A1 | * | 9/2005 | Garbar et al. ............... 524/440 |
| 2009/0120800 A1 |  | 5/2009 | Chung et al. |

(Continued)

FOREIGN PATENT DOCUMENTS

| | | |
|---|---|---|
| JP | 2003213441 A | 7/2003 |
| JP | 2005530005 A | 10/2005 |

(Continued)

*Primary Examiner* — Brian K Talbot
(74) *Attorney, Agent, or Firm* — The Webb Law Firm (57) ABSTRACT

Provided are a method for manufacturing a transparent conductive film and a transparent conductive film manufactured thereby, the method including: a) forming a coating film by coating a transparent conductive film coating solution on a substrate, the transparent conductive film coating solution including a non-polar solvent; a polar solvent; a conductive metal ink; and a surfactant; and b) forming a conductive pattern having a hole type transmissive part and a pattern part formed of the conductive metal ink, on the substrate, by drying and burning the coating film.

16 Claims, 1 Drawing Sheet

(56) References Cited

U.S. PATENT DOCUMENTS

| | | |
|---|---|---|
| 2010/0166948 A1 | 7/2010 | Cho et al. |
| 2010/0261031 A1 | 10/2010 | Chung et al. |
| 2011/0003086 A1 | 1/2011 | Chung et al. |
| 2011/0124252 A1* | 5/2011 | Shimomura et al. ............... 442/1 |
| 2011/0154948 A1 | 6/2011 | Chung et al. |
| 2011/0175065 A1 | 7/2011 | de la Vega et al. |
| 2011/0193032 A1* | 8/2011 | Shi .......................... H01B 1/16 |
| | | 252/519.21 |
| 2013/0071557 A1* | 3/2013 | Haymov et al. ............ 427/126.1 |

FOREIGN PATENT DOCUMENTS

| | | |
|---|---|---|
| JP | 200841445 A | 2/2008 |
| JP | 2008546165 A | 12/2008 |
| JP | 2010500476 A | 1/2010 |
| JP | 201034039 A | 2/2010 |
| JP | 2010531033 A | 9/2010 |
| JP | 2011512644 A | 4/2011 |
| JP | 2011515003 A | 5/2011 |
| JP | 2012500903 A | 1/2012 |
| KR | 1999011487 A | 2/1999 |
| KR | 19990064113 A | 7/1999 |
| KR | 20000009405 A | 2/2000 |
| KR | 1020060012542 A | 2/2006 |
| KR | 1020060090180 A | 8/2006 |
| KR | 1020060097271 A | 9/2006 |
| KR | 1020080031730 A | 4/2008 |
| KR | 100856508 B1 | 9/2008 |
| WO | 2008153356 A2 | 12/2008 |
| WO | WO 2008/153356 * | 12/2008 |

* cited by examiner

METHOD FOR MANUFACTURING TRANSPARENT CONDUCTIVE FILM

TECHNICAL FIELD

The present invention relates to a method for manufacturing a transparent conductive film and a transparent conductive film manufactured thereby, capable of manufacturing a transparent conductive film having excellent conductivity and transmittance through a simple process.

BACKGROUND ART

Generally, a transparent conductive film has been used for necessary constitutions of electric and electron devices, such as, power applications of display devices, an electromagnetic interference shielding film of home appliances, transparent electrodes in various kinds of display fields such as LCD, OLED, FED, PDP, flexible display, electronic paper, and the like. As a material for the transparent conductive film currently used, an inorganic oxide conductive material such as indium-tin oxide (ITO), antimony-tin oxide (ATO), antimony-zinc oxide (AZO), or the like is mainly used.

When the transparent conductive film is manufactured by a sputtering method, an ion beam method, a vacuum deposition method, or the like, conventionally using the above materials, there can be manufactured a conductive film having high conductivity and excellent transmittance. However, facility investment cost is high due to a vacuum apparatus; the transparent conductive films are difficult to mass-produce and be larger; and the transparent conductive film has a limit in a transparent substrate requiring a low-temperature process, such as, particularly, a plastic film.

At the time of deposition by the sputtering process, the composition of the transparent conductive film is varied depending on the conditions such as oxygen partial pressure, temperature, and the like, resulting in rapidly changing transmittance and resistance of the thin film.

Thus, a method of using a transparent conductive film is suggested, the transparent conductive film being manufactured by performing coating using a wet coating method such as spin coating, spray coating, deposition coating, printing, or the like, which is appropriate for low cost and a large size, and then performing burning. For example, Korean Patent Laid-Open Publication No. 1999-011487 discloses a transparent conductive film using a metal fine particle and a binder; Korean Patent Laid-Open Publication No. 1999-064113 discloses a composition for a transparent conductive film, obtained by adding a hollow type carbide fine fiber to tin oxide; and Korean Patent Laid-Open Publication No. 2000-009405 discloses a coating solution for forming a transparent conductive type photo-selective absorbing film, obtained by adding neodymium oxide to tin oxide or indium oxide. In addition, Japanese Patent Laid-Open Publication No. 2003-213441 discloses a method for preparing a solution for forming a transparent conductive layer, containing a metal fine particle of gold, silver, or the like.

The transparent conductive films manufactured by the above methods have high sheet resistance; fail to maintain initial conductivity due to occurrence of aging characteristics, such as, surface resistance increases with the passage of time by the change in surrounding environments; are limited in the use of a transparent conductive film due to low transmittance; and exhibits deteriorated productivity due to complicated processes and lots of processes.

DISCLOSURE

Technical Problem

An object of the present invention is to provide a method for manufacturing a transparent conductive film and a transparent conductive film manufactured thereby, capable of manufacturing a transparent conductive film having excellent conductivity and transmittance while simplifying the manufacturing processes and thus decreasing the number of processes.

Technical Solution

In one general aspect, the present invention provides a method for manufacturing a transparent conductive film, the method including: a) forming a coating film by coating a transparent conductive film coating solution on a substrate, the transparent conductive film coating solution including a non-polar solvent; a polar solvent non-miscible with the non-polar solvent; a conductive metal ink miscible with any one of the non-polar solvent and the polar solvent; and a surfactant having a faster evaporation rate than the non-polar solvent and the polar solvent; and b) forming a conductive pattern having a hole type transmissive part and a pattern part formed of the conductive metal ink, on the substrate, by drying and burning the coating film, comprising: b1) allowing phase separation into two non-miscible phases when the surfactant evaporates, the phase separation occurring into one solvent containing the conductive metal ink and the other solvent, depending on the miscibility with the conductive metal ink between the non-polar solvent and the polar solvent; and b2) allowing the non-polar solvent and the polar solvent to evaporate in a phase separation state, to leave the conductive metal ink on the substrate, to thereby form the transmissive part and the pattern part. In another general aspect, the present invention provides a transparent conductive film manufactured by the method.

Advantageous Effects

As set forth above, according to the present invention, there can be provided a method for manufacturing a transparent conductive film and a transparent conductive film manufactured thereby, capable of manufacturing a transparent conductive film having excellent conductivity and transmittance while simplifying the manufacturing processes and thus decreasing the number of processes.

BEST MODE

A method for manufacturing a transparent conductive film according to the present invention, may include: a) forming a coating film by coating a transparent conductive film coating solution on a substrate, the transparent conductive film coating solution including a non-polar solvent; a polar solvent non-miscible with the non-polar solvent; a conductive metal ink miscible with any one of the non-polar solvent and the polar solvent; and a surfactant having a faster evaporation rate than the non-polar solvent and the polar solvent; and b) forming a conductive pattern having a hole type transmissive part and a pattern part formed of the conductive metal ink, on the substrate, by drying and burning the coating film, comprising: b1) allowing phase separation into two non-miscible phases when the surfactant evaporates, the phase separation occurring into one solvent containing the conductive metal ink and the other solvent, depending on the miscibility with the conductive metal ink between the non-polar solvent and the polar solvent; and b2) allowing the non-polar solvent and the polar solvent to evaporate in a phase separation state, to leave the conductive metal ink on the substrate, to thereby form the transmissive part and the pattern part. As the substrate in step a), any kind of substrate on which a thin film or a pattern can be easily formed by a coating or printing process may be used.

For example, a transparent plastic film of polyimide (PI), polyethylene terephthalate (PET), polyethylene naphthalate (PEN), polyethersulfone (PES), nylon, polytetrafluoroethylene
(PTFE), polyetheretherketone (PEEK), polycarbonate (PC), polyarylate (PAR), or the like, or a glass substrate may be used. However, the kind of substrate is not limited thereto.

Meanwhile, the method for manufacturing a transparent conductive film according to the present invention may further include, before coating the transparent conductive film coating solution on the substrate, pre-treating the substrate, in step a).

The substrate may be used after being washed and degreased, or may be used after being particularly pretreated. The method of pre-treating may include treatment methods using plasma, ion beam, corona, oxidation or reduction, heat, etching, and UV irradiation, and a primer treatment method using the binder or additive, but are not limited thereto.

The conductive metal ink in step a) may include a silver complex compound for forming the conductive pattern. The silver complex compound may be prepared by reacting at least one silver compound selected from Chemical Formula 1 below with at least one ammonium carbamate based compound or ammonium carbonate based compound selected from Chemical Formulas 2 to 4 below. The silver complex compound may be composed of silver and an ammonium carbamate based compound or an ammonium carbonate based compound.

$Ag_nX$          [Chemical Formula 1]

(Wherein, n is an integer of 1~4, and X is a substituent selected from the group consisting of oxygen, sulfur, halogen, cyano, cyanate, carbonate, nitrate, nitrite, sulfate, phosphate, thiocyanate, chlorate, perchlorate, tetrafluoroborate, acetylacetonate, carboxylate, and derivatives thereof.)

[Chemical Formula 2]

[Chemical Formula 3]

[Chemical Formula 4]

(Wherein, $R_1$, $R_2$, $R_3$, $R_4$, $R_5$, and $R_6$ each are independently a substituent selected from hydrogen, aliphatic or cycloaliphatic (C1-C30)alkyl, aryl, aralkyl, functional group substituted (C1-C30)alkyl, functional group substituted aryl, a polymer compound group, a heterocyclic compound, and derivatives thereof, or $R_1$ and $R_2$, and $R_4$ and $R_5$, each may be independently linked via alkylene containing or not containing a hetero atom to form a ring.) Meanwhile, there may be excluded a case where all of $R_1$ to $R_6$ are hydrogen.

Specific examples of the silver compound of Chemical Formula 1 may be silver oxide, silver thiocyanate, silver sulfate, silver chloride, silver cyanide, silver cyanate, silver carbonate, silver nitride, silver nitrite, silver sulfate, silver phosphate, silver perchlorate, silver tetrafluoroborate, silver acetylacetonate, silver acetate, silver lactate, silver oxalate, and derivatives thereof, but are not limited thereto.

Specific examples of $R_1$ to $R_6$ each may be selected from hydrogen, methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, allyl, hydroxy, methoxy, hydroxyethyl, methoxyethyl, 2-hydroxy propyl, methoxypropyl, cyanoethyl, ethoxy, butoxy, hexyloxy, methoxyethoxyethyl, methoxyethoxyethoxyethyl, hexamethyleneimine, morpholine, piperidine, piperazine, ethylenediamine, propylenediamine, hexamethylenediamine, triethylenediamine, pyrrole, imidazole, pyridine, carboxymethyl, trimethoxysilylpropyl, triethoxysilylpropyl, phenyl, methoxyphenyl, cyanophenyl, phenoxy, tolyl, benzyl, and derivatives thereof, and high molecular compounds such as polyallylamine and polyethyleneimine, and derivatives thereof, but are not limited thereto.

Examples of the ammonium carbamate based compound of Chemical Formula 2 may be one or a mixture of two or more selected from the group consisting of ammonium carbamate, ethyl ammonium, ethyl carbamate, isopropyl ammonium, isopropyl carbamate, n-butyl ammonium, n-butyl carbamate, isobutyl ammonium isobutyl carbamate, t-butyl ammonium t-butyl carbamate, 2-ethylhexyl ammonium 2-ethylhexyl carbamate, octadecyl ammonium octadecyl carbamate, 2-methoxyethyl ammonium 2-methoxyethyl carbamate, 2-cyanoethyl ammonium 2-cyanoethyl carbamate, dibutyl ammonium dibutyl carbamate, dioctadecyl ammonium dioctadecyl carbamate, methyldecyl ammonium methyldecyl carbamate, hexamethyleneimine ammonium, hexamethyleneimine carbamate, morpholinium morpholine carbamate, pyridinium ehtylhexyl carbamate, triethylenediaminium isopropyl carbamate, benzyl ammonium benzyl carbamate, triethoxysilylpropyl ammonium triethoxysilylpropyl carbamate, and derivatives thereof.

Examples of the ammonium carbonate based compound of Chemical Formula 3 may be one or a mixture of two or more selected from the group consisting of ammonium carbonate, ethylammonium ethylcarbonate, isopropylammonium isopropylcarbonate, n-butylammonium n-butylcarbonate, isobutylammonium isobutylcarbonate, t-butylammonium t-butylcarbonate, 2-methoxyethylammonium 2-methoxyethylcarbonate, 2-ethylhexylammonium 2-ethylhexylcarbonate, 2-cyanoethylammonium 2-cyanoethylcarbonate, octadecylammonium octadecylcarbonate, dibutylammonium dibutyl-carbonate, dioctadecylammonium dioctadecylcarbonate, methyldecylammonium methyldecylcarbonate, hexamethyleneiminammonium, hexamethyleneiminecarbonate, morpholineammonium morpholinecarbonate, benzylammonium benzylcarbonate, triethoxysilylpropylammonium triethoxysilylpropylcarbonate, triethylenediaminium isopropylcarbonate, and derivatives thereof.

Examples of the ammonium bicarbonate based compound of Chemical Formula 4 may be one or a mixture of two or more selected from the group consisting of ammonium bicarbonate, isopropylammonium bicarbonate, t-butylammonium bicarbonate, 2-ethylhexylammonium bicarbonate, 2-methoxyethylammonium bicarbonate, 2-cyanoethylammonium bicarbonate, dioctadecylammonium bicarbonate, pyridium bicarbonate, triethylenediaminium bicarbonate, and derivatives thereof.

Meanwhile, the kinds and preparing methods of the ammonium carbamate based, ammonium carbonate based, or ammonium bicarbonate based compounds do not need to be particularly limited. For example, U.S. Pat. No. 4,542,214 (Sep. 17, 1985) discloses that an ammonium carbamate based compound may be prepared from primary amine, secondary amine, tertiary amine, or a mixture of one or more thereof and carbon dioxide, and an ammonium carbonate based compound may be obtained when 0.5 mole of water per 1 mole of the amine is further added thereto and an ammonium bicarbonate based compound may be obtained when 1 mole or more of water is added thereto. Here, they may be prepared without a particular solvent at normal pressure or in a pressurized state. In the case of using a solvent, examples of the solvent may be alcohols such as methanol, ethanol, isopropanol, and butanol; glycols such as ethylene glycol and glycerin; acetates such as ethyl acetate, butyl acetate, and carbitol acetate, ethers such as diethyl ether, tetrahydrofuran, and dioxane; ketones such as methylethyl ketone and acetone; hydrocarbons such as hexane and heptane; aromatic hydrocarbons such as benzene and toluene; and halogen-substituted solvents such as chloroform, methylene chloride, and carbon tetrachloride; and mixture solvents thereof. The carbon dioxide may be bubbled in a gas phase or a solid phase dry ice may be used for the carbon dioxide. The carbon dioxide may react in a supercritical state. In order to prepare the ammonium carbamate based, ammonium carbonate based, or ammonium bicarbonate based derivatives according to the present invention, any known method may be employed as long as final materials have the same structure, besides the foregoing methods. That is, the solvent, reaction temperature, concentration, catalyst, or the like for preparing thereof does not need to be particularly limited, and this also corresponds to the preparation yield.

The organic silver complex compound may be prepared by allowing the thus prepared ammonium carbamate based compound or the ammonium carbonate based compound to react with a silver compound. For example, at least one of the silver compound as shown in Chemical Formula 1 and at least one ammonium carbamate based derivative or ammonium carbonate based derivative as shown in Chemical Formulas 2 to 4 are allowed to directly react with each other without the solvent at normal pressure or in a pressuring state under nitrogen ambience. In the case of using the solvent, examples of the solvent may be alcohols such as methanol, ethanol, isopropanol, and butanol; glycols such as ethylene glycol and glycerin; acetates such as ethyl acetate, butyl acetate, and carbitol acetate, ethers such as diethyl ether, tetrahydrofuran, and dioxane; ketones such as methylethyl ketone and acetone; hydrocarbons such as hexane and heptane; aromatic hydrocarbons such as benzene and toluene; and halogen-substituted solvents such as chloroform, methylene chloride, and carbon tetrachloride; and the like. However, the method for preparing the organic silver complex compound does not need to be particularly limited. That is, any known method may be employed as long as final materials have the same structure. For example, the solvent, reaction temperature, concentration, catalyst, or the like for preparing thereof does not need to be particularly limited, and this also corresponds to the preparation yield.

In addition, with respect to preparation of the silver complex compound, a silver complex compound obtained by preparing a solution in which a silver compound of Chemical Formula 1 and at least one amine compound are mixed, and then reacting it with carbon dioxide, besides the foregoing methods, may be used in the present invention. Herein, the direct reaction may be advanced without a solvent at normal pressure or in a pressurized state or the reaction may be advanced with using a solvent, as described above. However, the method for preparing the organic silver complex compound does not need to be particularly limited. That is, any known method may be employed as long as final materials have the same structure. For example, the solvent, reaction temperature, concentration, catalyst, or the like for preparing thereof does not need to be particularly limited, and this also corresponds to the preparation yield.

Meanwhile, the silver complex compound may be represented by Chemical Formula 5 below.

$$Ag[A]_m \qquad \text{[Chemical Formula 5]}$$

In Chemical Formula 5, A is a compound of any one of Chemical Formulas 2 to 4, and m is 0.7 to 2.5.

The silver complex compound is characterized by being well dissolved in various solvents including the solvents for preparing the organic silver complex compound of the present invention, e.g., alcohols such as methanol and the like, esters such as ethylacetate and the like, and ethers such as tetrahydrofuran and the like. Therefore, the silver complex compound may be easily applied in a coating or printing process, and the silver complex compound also forms a very stable solution in view of stability such as storage or the like and thus may be stably stored in a solution state for 3 months or longer.

In addition, the organic silver complex compound solution may be coated on a substrate such as glass, silicon wafer, a polymer film of polyester or polyimide, or the like, to form a thin film, or may be directly printed.

The conductive metal ink in step a) may further include, as necessary, a stabilizer, a thin film aid, a solvent, a binder resin, a surfactant, a wetting agent, a dispersant, a thixotropic agent, a leveling agent, or a reducing agent, as an additive.

Examples of the stabilizer may be amine compounds such as primary amine, secondary amine, and tertiary amine; the ammonium carbamate based, ammonium carbonate based, and ammonium bicarbonate based compounds; phosphorous compounds such as phosphine, phosphite, and phosphate; sulfur compounds such as thiol and sulfide; and mixtures thereof.

Specific examples of the amine compound may be methyl amine, ethyl amine, n-propyl amine, iso-propyl amine, n-butyl amine, isobutyl amine, isoamyl amine, n-hexyl amine, 2-ethylhexyl amine, n-heptyl amine, n-octyl amine, isooctyl amine, nonyl amine, decyl amine, dodecyl amine, hexadecyl amine, octadecyl amine, docodecyl amine, cyclopropyl amine, cyclopentyl amine, cyclohexyl amine, allyl amine, hydroxy amine, ammonium hydroxide, methoxy amine, 2-ethanol amine, methoxy ethyl amine, 2-hydroxy propyl amine, 2-hydroxy-2-methylpropyl amine, methoxy propyl amine, cyanoethyl amine, ethoxy amine, n-butoxy amine, 2-hexyloxy amine, methoxy ethoxy ethyl amine, methoxy ethoxy ethoxy ethyl amine, diethyl amine, dipropyl amine, diethanol amine, hexamethylene imine, morpholine, piperidine, piperazine, ethylene diamine, propylene diamine, hexamethylene diamine, triethylene diamine, 2,2-(ethylenedioxy)bisethyl amine, triethylamine, triethanol amine, pyrrole, imidazole, pyridine, aminoacetaldehyde dimethylacetal, 3-aminopropyl trimethoxysilane, 3-aminopropyl triethoxysilane, aniline, anisidine, aminobenzonitrile, benzyl amine, and derivatives thereof, polymer compounds such as polyallyl amine and polyethylene amine and derivatives thereof.

Examples of the ammonium carbamate based compound may be ammonium carbamate, ethyl ammonium ethyl carbamate, isopropyl ammonium isopropyl carbamate, n-butyl ammonium n-butyl carbamate, isobutyl ammonium isobutyl carbamate, t-butyl ammonium t-butyl carbamate, 2-ethylhexyl ammonium 2-ethylhexyl carbamate, octadecyl ammonium octadecyl carbamate, 2-methoxyethyl ammonium 2-methoxyethyl carbamate, 2-cyanoethyl ammonium 2-cyanoethyl carbamate, dibutyl ammonium dibutyl carbamate, dioctadecyl ammonium dioctadecyl carbamate, methyldecyl ammonium methyldecyl carbamate, hexamethyleneimine ammonium, hexamethyleneimine carbamate, morpholinium morpholine carbamate, pyridinium ehtylhexyl carbamate, triethylenediaminum isopropyl carbamate, benzyl ammonium benzyl carbamate, triethoxysilylpropyl ammonium triethoxysilylpropyl carbamate, and derivatives thereof.

Examples of the ammonium carbonate based compound may be ammonium carbonate, ethyl ammonium ethyl carbonate, isopropyl ammonium, isopropyl carbonate, n-butyl ammonium n-butyl carbonate, isobutyl ammonium isobutyl carbonate, t-butyl ammonium t-butyl carbonate, 2-ethylhexyl ammonium 2-ethylhexyl carbonate, 2-methoxyethyl ammonium 2-methoxyethyl carbonate, 2-cyanoethyl ammonium 2-cyanoethyl carbonate, octadecyl ammonium octadecyl carbonate, dibutyl ammonium dibutyl carbonate, dioctadecyl ammonium dioctadecyl carbonate, methyldecyl ammonium methyldecyl carbonate, hexamethyleneimine ammonium, hexamethyleneimine carbonate, morpholine ammonium morpholine carbonate, benzyl ammonium benzyl carbonate, triethoxysilylpropyl ammonium triethoxysilylpropyl carbonate, triethylenediaminium isopropyl carbonate, and derivatives thereof.

Examples of the ammonium carbonate based compound may be ammonium bicarbonate, isopropyl ammonium bicarbonate, t-butyl ammonium bicarbonate, 2-ethylhexyl ammonium bicarbonate, 2-methoxyethyl ammonium bicarbonate, 2-cyanoethyl ammonium bicarbonate, dioctadecyl ammonium bicarbonate, pyridium bicarbonate, triethylenediaminium bicarbonate, and derivatives thereof.

The phosphorous compound is represented by chemical formulas $R_3P$, $(RO)_3P$, or $(RO)_3PO$, and here, R is (C1-C20) alkyl or aryl, and representative examples thereof may be tributyl phosphine, triphenyl phosphine, triethyl phosphite, triphenyl phosphite, dibenzyl phosphate, triethyl phosphate, and the like.

Examples of the sulfur compound may be butane thiol, n-hexane thiol, diethyl sulfide, tetrahydrothiophene, allyl disulfide, mercaptobenzothiozole, alkylmercaptoacetate, tetrahydrothiophene, octylthioglycorate, and the like.

The use amount of the stabilizer does not need to be particularly limited as long as it is suitable to ink characteristics of the present invention. However, the content thereof is preferably 0.1%~90%, and more preferably 1%~50%, in terms of a mole ratio to the silver compound. If above this range, conductivity of the thin film may be deteriorated, and if below this range, storage stability of the ink may be deteriorated.

As a thin film aid, organic acid and organic acid derivatives may be used, and may be composed of one or a mixture of two or more thereof Examples of the organic acid may be acetic acid, oxalic acid, citric acid, lactic acid, maleic acid, acrylic acid, butyric acid, valeric acid, pivalic acid, n-hexanoic acid, t-octanoic acid, 2-ethyl-hexanoic acid, neodecanoic acid, lauric acid, stearic acid, oleic acid, naphthenic acid, dodecanoic acid, linoleic acid, and the like.

Examples of the organic acid derivatives may be organic acid ammonium salts, such as, acetic acid ammonium salt, citric acid ammonium salt, lauric acid ammonium salt, lactic acid ammonium salt, maleic acid ammonium salt, oxalic acid ammonium salt, ant the like; and organic acid metal salts containing metals such as Au, Cu, Zn, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Sm, Eu, Ac, Th, and the like.

Examples of the organic acid metal salt may be manganese oxalate, gold acetate, palladium oxalate, silver 2-ethylhexanoate, silver octanoate, silver neodecanoate, cobalt stearate, nickel naphthenate, cobalt naphthenate, and the like.

The use amount of the thin film aid is not particularly limited, but the content thereof may be preferably 0.1%~25%, in terms of a mole ratio to the silver complex compound or the mixture. If above this range, it is difficult to form a uniform thin film, and if below this range, cracks may occur in the thin film.

As necessary, the solvent may be used to control viscosity of a silver complex compound solution or smoothly form the thin film.

Examples of the solvent may be alcohols such as methanol, ethanol, sopropanol, 1-methoxypropanol, butanol, ethylhexyl alcohol, and terpineol: glycols such as ethylene glycol and glycerin: acetates such as ethyl acetate, butyl acetate, methoxypropyl acetate, carbitol acetate, and ethylcarbitol acetate; ethers such as methyl cellosolve, butyl cellosolve, diethyl ether, tetrahydrofuran, dioxane; ketones such as methylethyl ketone, acetone, dimethylformamide, and 1-methyl-2-pyrrolidone; hydrocarbons, such as hexane, heptane, dodecane, paraffin oil, mineral spirit; aromatic hydrocarbons such as benzene, toluene, and xylene; halogen substituted solvent, such as chloroform, methylene chloride, and carbon tetrachloride; acetonitril; dimethyl sulfoxide; and mixtures thereof.

As the binder resin, thermoplastic resins, for example, acyl based resins such as polyacrylic acid and polyacrylic acid ester, cellulose based resins such as ethyl cellulose and the like, aliphatic or copolymerized polyester based resins, vinyl based resins such as polyvinyl butyral and polyvinyl acetate, and olefin based resins such as polyurethane resin, polyether and urea resin, alkyd resin, silicone resin, fluorine resin, and polyethylene, and petroleum and rosin based resins; thermosetting resins such as epoxy based resins, unsaturated polyester based resins, phenol based resins, melamine based resins; UV or electron beam setting type various structured acryl based resins; ethylene-propylene based rubber, styrene-butadiene based rubber, or the like, may be used together.

Examples of the surfactant may be negative ionic surfactants such as sodium lauryl sulfate and the like; non-ionic surfactants such as nonyl phenoxy-polyethoxyethanol and FSN as the Dupont Product; positive ionic surfactants such as lauryl benzyl ammonium chloride and the like; amphiphilic surfactants such as lauryl betaine and coco betaine; and the like.

Examples of the wetting agent or wetting dispersant may be compounds. such as, polyethylene glycol, THERPINOL series as products of the Air Product Company, and TEGO WET series as products of the Deguessa Company.

Examples of the thixotropic agent or leveling agent may be BYK series of the BYK Company, Glide series of the Degussa Company, EFKA 3000 series of the EFKA Company, DSX series of the Cognis Company, and the like.

The reducing agent may be added to facilitate burning, and examples thereof may be hydrazine, acetic hydrazide, sodium or potassium borohydride, trisodium citrate, amine compounds such as methyldiethanolamine and dimethylamineborane, metal salts such as ferric chloride and iron lactate, hydrogen, hydrogen iodide, carbon monoxide, aldehyde compounds such as formaldehyde and acetaldehyde, organic compounds such as glucose, ascorbic acid, salicylic acid, tannic acid, pyrogallol, and hydroquinone, and the like.

The foregoing method for preparing a silver complex compound, transparent silver ink, is disclosed in Korean Patent Application No. 10-2006-0011083 and 10-2005-0018364 by the present applicant.

It has been previously described that the conductive metal ink containing the silver complex compound may be used as the conductive metal ink in step a). Here, the transparent silver ink may be obtained by preparing a solution in which the silver compound of Chemical Formula 1 above is mixed with a large amount of at least one amine compound, ammonium carbamate based compound, or ammonium carbonate based compound, adding the binder or the additive thereto as necessary, and then reacting it with carbon dioxide. Also here, the direct reaction may be advanced without a solvent at normal pressure or in a pressurized state or the direction may be advanced with using a solvent, as described above.

Specifically, as the conductive metal ink of step a), a transparent silver ink prepared from carbamate obtained by reacting 2-ethyl-1-hexylamine and carbon dioxide may be used or a transparent silver ink prepared from carbamate obtained by reacting a mixture of 2-ethyl-1-hexylamine and isobutyl amine with carbon dioxide may be used.

In step a), the non-polar solvent is miscible with the conductive metal ink and the polar solvent is non-miscible with the conductive metal ink and the non-polar solvent. In this case, in step b1), the transparent conductive film coating solution may be phase-separated into the non-polar solvent containing the conductive metal ink and the polar solvent.

In this case, in step a), the non-polar solvent have solubility in the conductive metal ink but non-solubility in the polar solvent, and may include at least one solvent selected from aromatic solvent, hydrocarbon based solvent, alcohol having four or more aliphatic chains, ether based solvent, and ester based solvent.

Specifically, as the non-polar solvent, an organic solvent having, for example, low Hydrophilicity, that is, low polarity, may be used in order to exhibit phase separation characteristics with respect to the polar solvent.

In addition, as the non-polar solvent, any solvent that is not mixed with and thus non-soluble with respect to the polar solvent, that is, non-miscible with the polar solvent; can dissolve and thus is soluble with respect to the conductive metal ink containing the silver complex compound, that is, miscible with the conductive metal ink; and has a slower evaporation rate than the volatile surfactant, may be variously applied in the present invention.

Examples thereof may be aromatic solvents such as BTX (benzene, toluene, and xylene), hydrocarbon based solvents such as hexane, cyclohexane, and the like, isobutyl alcohol, 2-ethyl-1-hexyl alcohol, alcohols having four or more aliphatic chains, ethers, and esters, but are not limited thereto.

Any solvent that can satisfy the above conditions may be variously applied.

In step a), the polar solvent has non-solubility with respect to the conductive metal ink and the non-polar solvent, and may include water. However, the polar solvent is not limited thereto.

Specifically, as the polar solvent in step a), any solvent that is not mixed with and thus non-soluble with respect to the non-polar solvent, that is, non-miscible with the non-polar solvent; not mixed with and thus non-soluble with respect to the conductive metal ink containing the silver complex compound, that is, non-miscible with the conductive metal ink; and has a slower evaporation rate than the volatile surfactant, may be variously applied in the present invention.

In addition, in step a), the non-polar solvent is non-miscible with the conductive metal ink and the polar solvent, and the polar solvent is miscible with the conductive metal ink. In this case, in step b1), the phase separation may occur into the non-polar solvent containing the conductive metal ink and the polar solvent.

The surfactant in step a) is a volatile surfactant having solubility with respect to the conductive metal ink, the non-polar solvent, and the polar solvent, and may include at least one selected from methanol, ethanol, propanol, and isopropanol.

Specifically, as the surfactant in step a), any surfactant that can have affinity with both of the polar solvent and the non-polar solvent in which the conductive metal ink containing the silver complex compound is dissolved, and thus is well mixed with the polar solvent and the non-polar solvent in which the conductive metal ink containing the silver complex compound is dissolved, and have a faster evaporation rate than the polar solvent and the non-polar solvent, may be variously applied in the present invention.

For example, lower alcohols are preferable, and specifically, methanol, ethanol, propanol, or isopropanol may be preferable. Alternatively, surfynol may be used. Of these, isopropanol may be more preferable in view of phase separation characteristics.

In the transparent conductive film coating solution in step a), the surfactant, the non-polar solvent, and the polar solvent may be arranged in order of faster evaporation rate.

Alternatively, in the transparent conductive film coating solution in step a), the surfactant, the polar solvent, and the non-polar solvent may be arranged in order of faster evaporation rate. Here, there are various methods of confirming the difference in evaporation rate, relatively faster or slower, and for example, the flash point (FP) may be used.

As such, in order to allow phase separation into the non-polar solvent and the polar solvent, a surfactant that can first evaporate due to a relatively faster evaporation rate than the non-polar solvent and the polar solvent needs to be used so that the volatile surfactant first evaporates.

The solvents may be selected so that the non-polar solvent and the polar solvent simultaneously evaporate; the non-polar solvent evaporates before the polar solvent by using the non-polar solvent having a relatively faster evaporation rate than the polar solvent; or the polar solvent evaporates before the non-polar solvent by using the non-polar solvent having a relatively slower evaporation rate than the polar solvent.

In step a), the coating method of the transparent conductive film coating solution may be selected from spin coating, roll coating, spray coating, dip coating, flow coating, doctor blade coating and dispensing, inkjet printing, offset printing, screen printing, pad printing, gravure printing, flexography printing, stencil printing, imprinting, xerography and lithography.

Meanwhile, in step b), the conductive pattern is formed on the substrate by drying and burning the coating film formed in step a).

The drying and burning of step b) may be performed through heat treatment.

For example, the heat treatment may be performed at normally 80~400° C., preferably 90~300° C., and more preferably 100~150° C. In addition, the heat treatment may be performed in two or more stages at a low temperature and a high temperature in the above range. For example, the heat treatment may be performed at 80~150° C. for 1~30 minutes, and at 150~300° C. for 1~30 minutes.

Figure 1:
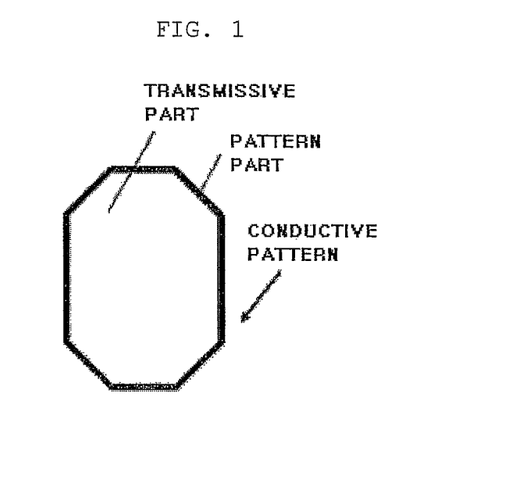
FIG. 1 is a schematic view showing a transparent part and a pattern part, formed by phase separation of a non-polar solvent, in which a conductive metal ink is dissolved, and a polar solvent, according to the present invention.

In step b), the transmissive part corresponds to a space where the polar solvent occupies on the substrate before evaporating, and is formed after the polar solvent evaporates. The pattern part may be formed by allowing the conductive metal ink dissolved in the non-polar solvent to remain on the substrate while the non-polar solvent evaporates (See, FIG. 1).

Alternatively, in step b), the transmissive part corresponds to a space where the non-polar solvent occupies before evaporating, and is formed after the non-polar solvent evaporates. The pattern part may be formed by allowing the conductive metal ink dissolved in the polar solvent to remain on the substrate while the polar solvent evaporates (See, FIG. 1).

Figure 2:
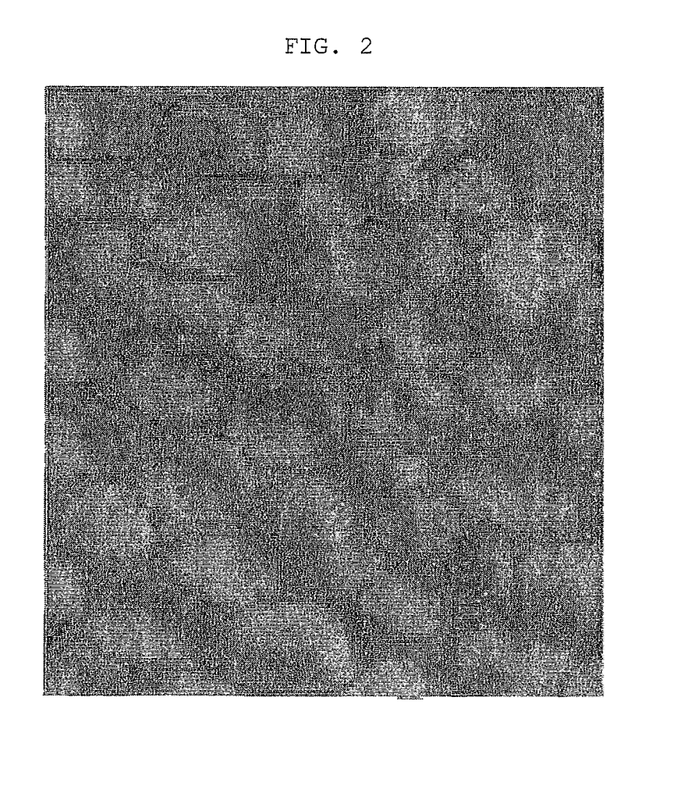
FIG. 2 is an optical microscope image obtained by observing a conductive pattern (irregular mesh shape) of a transparent conductive film according to Example 1.

In step b), the conductive pattern may have a regular mesh type having a hole type transmissive part and a pattern part formed of the conductive metal ink (see, FIG. 2).

Hereinafter, a procedure of forming the conductive pattern on a surface of the substrate by step a) and step b) will be described in detail.

In the transparent conductive film coating solution of step a), since the surfactant has affinity with both of the non-polar solvent and the polar solvent, the phase separation of the non-polar solvent and the polar solvent does not occur even until the transparent conductive film coating solution is coated on the substrate. That is, until this time, the transparent conductive film coating solution is allowed to be present in a one-component type coating solution including the conductive metal ink, the non-polar solvent, the polar solvent, and the surfactant.

Instead of this one-component type coating solution, in the case where a coating solution is obtained by preparing a metal powder solution and preparing an emulsion and then mixing them, there are disadvantages that a separate process for the emulsion is needed, resulting in increasing the number of processes; the emulsion is low in liquid stability; and the heat treatment needs to be performed in the conditions of a reducing agent in order to form patterns. However, the transparent conductive film coating solution of the present invention has a one-component type and thus excellent liquid stability. Therefore, when the transparent conductive film coating solution is prepared to have a one-component type and then coated, it is phase-separated and then forms a pattern after heat treatment without the conditions of a separate reducing agent, so that a conductive pattern having excellent conductivity and transmissive can be easily obtained through a simplified process.

When the transparent conductive film coating solution is coated on the substrate in step a) and then the surfactant, which has a relatively faster evaporation rate than the non-polar solvent and the polar solvent, first evaporates in step b), the phase separation occurs into the non-polar solvent containing the conductive metal ink dissolved therein as one phase and the polar solvent as the other phase, that is, two non-miscible phases.

Here, the polar solvent, e.g., water is distributed on the substrate, and the non-polar solvent containing the conductive metal ink dissolved therein is distributed while not being mixed with the water. For example, the conductive metal ink dissolved in the non-polar solvent may surround the water as the polar solvent.

Then, when the polar solvent and the non-polar solvent, which have relatively slower evaporation rates than the surfactant, evaporate, an empty space is generated at the place where the polar solvent, e.g., water positioned on a surface of the substrate evaporates, and thus becomes the transmissive part. In addition, since the non-polar solvent evaporates to leave only the conductive metal ink on the surface of the substrate, the conductive metal ink remaining the surface of the substrate becomes the pattern part.

Alternatively, the procedure may be advanced as follows.

In the transparent conductive film coating solution of step a), since the surfactant has affinity with both of the non-polar solvent and the polar solvent, the phase separation into the non-polar solvent and the polar solvent does not occur until the transparent conductive film coating solution is coated on the substrate. That is, until this time, the transparent conductive film coating solution is allowed to be present as a one-component type coating solution including the conductive metal ink, the non-polar solvent, the polar solvent, and the volatile surfactant.

When the transparent conductive film coating solution is coated on the substrate in step a) and then the surfactant, which has a relatively faster evaporation rate than the non-polar solvent and the polar solvent, first evaporates in step b), the phase separation occurs into the polar solvent containing the conductive metal ink dissolved therein as one phase and the non-polar solvent as the other phase, that is, two non-miscible phases.

Here, the non-polar solvent is distributed on the substrate, and the polar solvent containing the conductive metal ink dissolved therein is distributed while not being mixed with the non-polar solvent. For example, the conductive metal ink dissolved in the polar solvent may surround the non-polar solvent.

Then, when the polar solvent and the non-polar solvent, which have relatively slower evaporation rates than the surfactant, evaporate, an empty space is generated at the place where the non-polar solvent positioned on the surface of the substrate evaporates, and thus becomes the transmissive part. In addition, since the polar solvent evaporates to leave only the conductive metal ink on the surface of the substrate, the conductive metal ink remaining the surface of the substrate becomes the pattern part.

As described above, a conductive pattern having the transmissive part and the pattern part can be formed through a simplified process, and the manufactured transparent conductive film having the thus formed conductive pattern can provide excellent conductivity and transmittance.

Hereinafter, the present invention will be described in more detail through the examples. However, the ranges of the present invention are not limited.

PREPARATIVE EXAMPLE

Preparative Example 1

Conductive Metal Ink 100 g of a mixture of viscous 2-ethyl-1-hexyl ammonium 2-ethyl-1-hexyl carbamate and isobutyl ammonium isobutyl carbamate was put in a SUS reaction container equipped with a constant temperature, and stirred while being maintained at 25° C. 30.7 g of silver oxide (I) was slowly put into the reaction container, and stirred for 5 hours while being maintained at 25° C. As the reaction proceeds, a black suspension solution became pale and then transparent while a complex compound was generated. After completion of the reaction, the reacted solution was filtered to remove silver oxide (I), thereby obtaining a transparent silver ink having a silver content of 23.5%.

Preparative Example 2

Conductive Metal Ink

Preparation was carried out by the same method as Example 1, except that 2-ethyl-1-hexyl ammonium 2-ethyl-1-hexyl carbamate was used instead of the mixture of 2-ethyl-1-hexyl ammonium 2-ethyl-1-hexyl carbamate and isobutyl ammonium isobutyl carbamate used in Preparation Example 1, thereby obtaining a transparent silver ink having a silver content of 17.5%.

Preparation Example 3

Transparent Conductive Film Coating Liquid 52.6 g of isopropanol and 4.3 g of a transparent silver ink obtained in Preparative Example 1 were mixed with each other and completely dissolved. 9.6 g of xylene and 4.8 g of isobutanol were added thereto, and completely dissolved. 28.8 g of purified water (deionized water) was slowly added and stirred. The materials were stirred for 10 minutes to thereby be completely mixed, and the stirred liquid was filtered by using a 0.45 μm-filter. A colorless transparent conductive film coating solution was obtained.

Preparation Example 4

Transparent Conductive Film Coating Liquid 51.2 g of isopropanol and 5.7 g of a transparent silver ink obtained in Preparative Example 2 were mixed with each other and completely dissolved. 9.6 g of xylene and 4.8 g of isobutanol were added thereto, and completely dissolved. 28.8 g of purified water (deionized water) was slowly added and stirred. The materials were stirred for 10 minutes to thereby be completely mixed, and the stirred liquid was filtered by using a 0.45 μm-filter. A colorless transparent conductive film ink was obtained.

Preparation Example 5

Transparent Conductive Film Coating Liquid 46.4 g of isopropyl alcohol and 7.3 g of a transparent silver ink obtained in Preparative Example 2 were mixed with each other and completely dissolved. 9.3 g of xylene and 9.3 g of isobutyl alcohol were added thereto, and completely dissolved. 27.8 g of purified water (deionized water) was slowly added and stirred. The materials were stirred for 10 minutes to thereby be completely mixed, and the stirred liquid was filtered by using a 0.45 μm-filter. A colorless transparent conductive film ink was obtained.

Preparation Example 6

Transparent Conductive Film Coating Liquid 47.1 g of isopropyl alcohol and 5.9 g of a transparent silver ink obtained in Preparative Example 2 were mixed with each other and completely dissolved. 23.5 g of hexane, 23.5 g of toluene, and 4.7 g of isobutyl alcohol were added thereto, and completely dissolved. 18.8 g of purified water (deionized water) was slowly added and stirred. The materials were stirred for 10 minutes to thereby be completely mixed, and the stirred liquid was filtered by using a 0.45 μm-filter. A colorless transparent conductive film ink was obtained.

EXAMPLES

Example 1

Manufacture of Transparent Conductive Film

1) Pretreatment of Substrate for Transparent Conductive Film

As a substrate for a transparent conductive film, SH82 (PET film), a product by the SK Company was used, and then subjected to normal pressure plasma treatment in order to increase hydrophilicity thereof. Here, the normal pressure plasma treatment was performed by controlling nitrogen gas flow to 200 lpm and oxygen gas flow to 4 lpm, controlling the plasma charging output to 12 kw, at a rate of 10 mm/s. A contact angle was measured 35° in terms of an integer value. Visible transmittance of the treated substrate was measured 90%.

2) Manufacture of Transparent Conductive Film

A transparent conductive film coating solution according to Preparative Example 3 was coated on a PET film after the pretreatment by using spin coating. Spin coating was performed under the conditions of 1000 rpm for 5 seconds. Drying and burning were performed in a convection oven at 150° C. for 3 minutes, to thereby obtain a irregular micromesh type transparent conductive film having visible transmittance of 70% and sheet resistance of $100\Omega/cm^2$ (see, FIG. 2).

Example 2

Manufacture of Transparent Conductive Film

A transparent conductive film was manufactured by the same method as Example 1, except that the transparent conductive film coating solution according to Preparative Example 4 was used instead of the transparent conductive film coating solution according to Preparative Example 3 used in Example 1. A irregular micro-mesh type transparent conductive film having visible transmittance of 65% and sheet resistance of $100\Omega/cm^2$ was obtained.

Example 3

Manufacture of Transparent Conductive Film

A transparent conductive film was manufactured by the same method as Example 1, except that the transparent conductive film coating solution according to Preparative Example 5 was used instead of the transparent conductive film coating solution according to Preparative Example 3 used in the Example 1. A irregular micro-mesh type transparent conductive film having visible transmittance of 68% and sheet resistance of $100\Omega/cm^2$ was obtained.

Example 4

Manufacture of Transparent Conductive Film

A transparent conductive film was manufactured by the same method as Example 1, except that the transparent conductive film coating solution according to Preparative Example 6 was used instead of the transparent conductive film coating solution according to Preparative Example 3 used in the Example 1. A irregular micro-mesh type transparent conductive film having visible transmittance of 60% and sheet resistance of 100Ω/cm² was obtained.

As described above, it may be seen from Examples 1 to 4 according to the present invention, that a transparent conductive film having excellent conductivity and transmittance can be manufactured by using the transparent conductive film coating solution including a conductive metal ink, a non-polar solvent, a polar solvent, and volatile surfactant, through a process simplified by using a difference in evaporation rate between the non-polar and polar solvents and the volatile surfactant and a phase separation phenomenon due to a repulsive force of the conductive metal ink and the non-polar and polar solvents.

The invention claimed is:

1. A method for manufacturing a transparent conductive film using a one-component type transparent conductive film coating solution including a polar solvent, a non-polar solvent, a conductive metal ink, and a volatile surfactant, the method comprising:
    a) forming a coating film by coating a one-component type transparent conductive film coating solution on a substrate, the one-component type transparent conductive film coating solution including all of the following: a non-polar solvent; a polar solvent non-miscible with the non-polar solvent; a conductive metal ink miscible with any one of the non-polar solvent and the polar solvent; and a volatile surfactant having a faster evaporation rate than the non-polar solvent and the polar solvent, and solubility with respect to the conductive metal ink, the polar solvent, and the non-polar solvent; and
    b) forming a conductive pattern having a hole type transmissive part and a pattern part formed of the conductive metal ink, on the substrate, by drying and burning the coating film, comprising: b1) evaporating the volatile surfactant first, thereby allowing phase separation into two non-miscible phases, the phase separation occurring into one solvent containing the conductive metal ink and the other solvent, depending on the miscibility with the conductive metal ink between the non-polar solvent and the polar solvent; and b2) allowing the non-polar solvent and the polar solvent to evaporate in a phase separation state, to thereby form the transmissive part which is formed in an empty space by evaporating a solvent of the polar solvent and the non-polar solvent having non-affinity with the conductive metal ink, and the pattern part in which the conductive metal ink having affinity with any one solvent of the polar solvent and the non-polar solvent is left,
    wherein water condensation does not occur while the polar and non-polar solvents evaporate.

2. The method of claim 1, wherein in step a), the substrate is a polyimide (PI), polyethylene terephthalate (PET), polyethylene naphthalate (PEN), polyethersulfone (PES), nylon, polytetrafluoroethylene (PTFE), polyetheretherketone (PEEK), polycarbonate (PC), polyarylate (PAR), or glass.

3. The method of claim 1, wherein in step a), the conductive metal ink includes a silver complex compound prepared by reacting at least one silver compound selected from Chemical Formula 1 below; and at least one ammonium carbamate based or ammonium carbonate based compound selected from Chemical Formulas 2 to 4 below:

Ag$_n$X                    [Chemical Formula 1]

(wherein, n is an integer of 1~4, and X is a substituent selected from the group consisting of oxygen, sulfur, halogen, cyano, cyanate, carbonate, nitrate, nitrite, sulfate, phosphate, thiocyanate, chlorate, perchlorate, tetrafluoroborate, acetylacetonate, carboxylate, and derivatives thereof),

[Chemical Formula 2]

[Chemical Formula 3]

[Chemical Formula 4]

(wherein, $R_1$, $R_2$, $R_3$, $R_4$, $R_5$, and $R_6$ each are independently a substituent selected from hydrogen, aliphatic or cycloaliphatic (C1-C30)alkyl, aryl, aralkyl, functional group substituted (C1-C30)alkyl, functional group substituted aryl, a polymer compound group, a heterocyclic compound, and derivatives thereof, or $R_1$ and $R_2$, and $R_4$ and $R_5$, each may be independently linked via alkylene containing or not containing a hetero atom to form a ring).

4. The method of claim 1, wherein the non-polar solvent is miscible with the conductive metal ink, and the polar solvent is non-miscible with the conductive metal ink and the non-polar solvent, and
    wherein in step b1), the phase separation occurs into the non-polar solvent containing the conductive metal ink and the polar solvent.

5. The method of claim 4, wherein in step a), the non-polar solvent has solubility with respect to the conductive metal ink and non-solubility with respect to the polar solvent, and includes at least one solvent selected from an aromatic solvent, a hydrocarbon based solvent, alcohol having four or more aliphatic chains, an ether based solvent, and an ester based solvent.

6. The method of claim 4, wherein in step a), the polar solvent has non-solubility with respect to the conductive metal ink and the non-polar solvent, and includes water.

7. The method of claim 1, wherein the non-polar solvent is non-miscible with the conductive metal ink and the polar solvent, and the polar solvent is miscible with the conductive metal ink, and
    wherein in step b1), the phase separation occurs into the polar solvent containing the conductive metal ink and the non-polar solvent.

8. The method of claim 1, wherein in step a), the surfactant is a volatile surfactant having solubility with respect to the conductive metal ink, the non-polar solvent, and the polar solvent, and includes at least one selected from methanol, ethanol, propanol, and isopropanol.

9. The method of claim 1, wherein in step b), the surfactant, the non-polar solvent, and the polar solvent evaporate in this order.

10. The method of claim 1, wherein in step b), the surfactant, the polar solvent, and the non-polar solvent evaporate in this order.

11. The method of claim 1, wherein in step a), a coating method of the transparent conductive film coating solution is selected from spin coating, roll coating, spray coating, dip coating, flow coating, doctor blade coating and dispensing, inkjet printing, offset printing, screen printing, pad printing, gravure printing, flexography printing, stencil printing, imprinting, xerography and lithography.

12. The method of claim 1, wherein the drying and burning in step b) comprises performing heat treatment.

13. The method of claim 4, wherein in step b), the transmissive part corresponds to a space where the polar solvent occupies on the substrate before evaporating, and is formed after the polar solvent evaporates, and wherein the pattern part is formed by allowing the conductive metal ink dissolved in the non-polar solvent to remain on the substrate while the non-polar solvent evaporates.

14. The method of claim 7, wherein in step b), the transmissive part corresponds to a space where the non-polar solvent occupies on the substrate before evaporating, and is formed after the non-polar solvent evaporates, and wherein the pattern part is formed by allowing the conductive metal ink dissolved in the polar solvent to remain on the substrate while the polar solvent evaporates.

15. The method of claim 1, wherein the conductive pattern in step b) is formed in a mesh shape having the hole type transmissive part and the pattern part formed of the conductive metal ink.

16. The method of claim 1, further comprising, before step a), pre-treating the substrate.

* * * * *